US 8,559,241 B2

(12) United States Patent
Park et al.

(10) Patent No.: US 8,559,241 B2
(45) Date of Patent: Oct. 15, 2013

(54) DATA RECEIVER, SEMICONDUCTOR DEVICE AND MEMORY DEVICE INCLUDING THE SAME

(75) Inventors: Sung-Joo Park, Anyang-si (KR); Jea-Eun Lee, Seoul (KR); Jung-Joon Lee, Seoul (KR); Yang-Ki Kim, Seoul (KR); Kyoung-Sun Kim, Uijeongbu-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 331 days.

(21) Appl. No.: 13/110,161

(22) Filed: May 18, 2011

(65) Prior Publication Data

US 2012/0014156 A1 Jan. 19, 2012

(30) Foreign Application Priority Data

Jul. 19, 2010 (KR) .................. 10-2010-0069409

(51) Int. Cl.
*G11C 7/10* (2006.01)
(52) U.S. Cl.
USPC ................................. 365/189.05; 365/230.08

(58) Field of Classification Search
USPC ..................... 365/189.05, 230.08, 230.06
See application file for complete search history.

(56) References Cited

U.S. PATENT DOCUMENTS

| 2005/0041504 A1* | 2/2005 | Perego et al. ............... 365/222 |
| 2009/0122587 A1* | 5/2009 | Matsui ........................ 365/51 |

FOREIGN PATENT DOCUMENTS

| JP | 11-144459 | 5/1999 |
| JP | 2004-062530 | 2/2004 |
| KR | 10-20040095097 A | 11/2004 |

* cited by examiner

*Primary Examiner* — Vu Le
(74) *Attorney, Agent, or Firm* — Muir Patent Consulting, PLLC

(57) ABSTRACT

A data receiver includes a first buffer circuit and a second buffer circuit. The first buffer circuit varies a resistance of a data path and a resistance of a reference voltage path based on a plurality of control signals, and adjusts a voltage level of an input data signal and a level of a reference voltage to generate an internal data signal and an internal reference voltage based on the varied resistance of the data path and the varied resistance of the reference voltage path. The second buffer circuit compares the internal data signal with the internal reference voltage to generate a data signal.

20 Claims, 11 Drawing Sheets

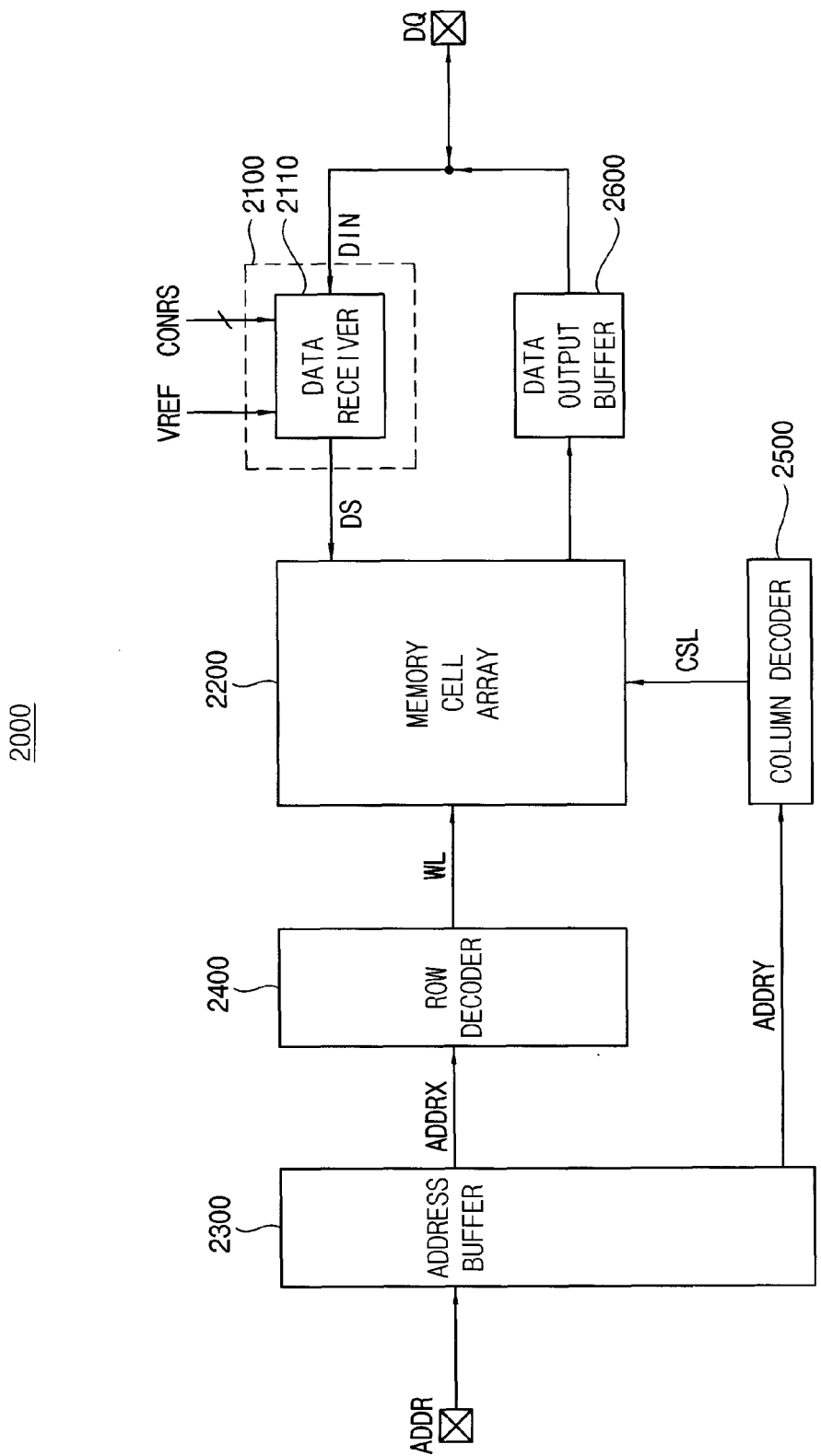

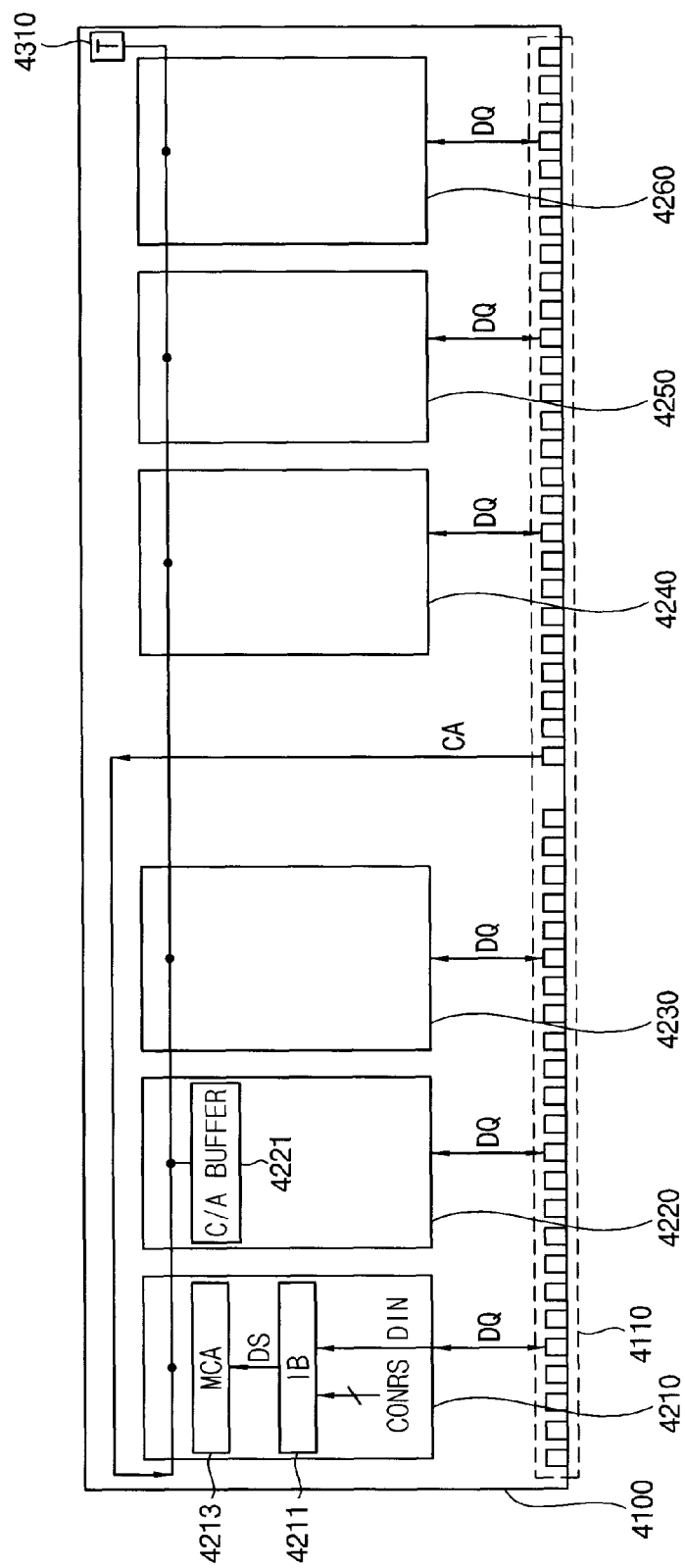

US 8,559,241 B2

DATA RECEIVER, SEMICONDUCTOR DEVICE AND MEMORY DEVICE INCLUDING THE SAME

CROSS-REFERENCE TO RELATED APPLICATION

This application claims priority under 35 USC§119 to Korean Patent Application No. 2010-0069409, filed on Jul. 19, 2010 in the Korean Intellectual Property Office (KIPO), the contents of which are herein incorporated by reference in their entirety.

BACKGROUND

1. Technical Field

Example embodiments relate to data communication, and more particularly to a data receiver and a memory module including the data receiver.

2. Description of the Related Art

Semiconductor memory devices transmit and receive data signals to and from external devices such as a memory controller and other semiconductor memory devices in a semiconductor system. When receiving the data signals, the semiconductor memory devices are required to determine whether the received data signals have logic high levels or logic low levels. Thus, the semiconductor memory devices include a data receiver or a data receiving apparatus that receives data signals and determines whether the received data signals have the logic high levels or the logic low levels.

SUMMARY

Accordingly, the inventive concept is provided to substantially obviate one or more problems due to limitations and disadvantages of the related art.

Some example embodiments provide a data receiver capable of improving integrity of received data signals.

Some example embodiments provide a memory module including the data receiver.

Some example embodiments provide a buffer (e.g., an address buffer, a command buffer, a control buffer, a clock buffer etc.) capable of improving integrity of received signals.

Some example embodiments provide a memory device including the buffer.

According to one embodiment, a data receiver includes a first buffer circuit and a second buffer circuit. The first buffer circuit varies a resistance of a data path and a resistance of a reference voltage path based on a plurality of control signals, and adjusts a voltage level of an input data signal and a level of a reference voltage to generate an internal data signal and an internal reference voltage based on the varied resistance of the data path and the varied resistance of the reference voltage path. The second buffer circuit compares the internal data signal with the internal reference voltage to generate a data signal.

The first buffer circuit may include a first variable resistor circuit and a second variable resistor circuit. The first variable resistor circuit may form a portion of the data path, may have a first resistance varied based on the plurality of control signals, and may adjust the voltage level of the input data signal based on the first resistance. The second variable resistor circuit may form a portion of the reference voltage path, may have a second resistance varied based on the plurality of control signals, and may adjust the level of the reference voltage based on the second resistance.

The first variable resistor circuit may include a plurality of first resistor circuit parts connected in parallel between a data input terminal and a first node. The second variable resistor circuit may include a plurality of second resistor circuit parts connected in parallel between a reference voltage input terminal and a second node.

Each of the plurality of first resistor circuit parts may include a resistor and a transmission gate. The resistor may be connected to the data input terminal. The transmission gate may be connected between the resistor and the first node, and may operate in response to a respective one of the plurality of control signals.

Each of the plurality of first resistor circuit parts may include a first transistor and a second transistor. The first transistor may be connected between the data input terminal and the first node, and may have a gate electrode receiving a respective one of the plurality of control signals. The second transistor may be connected between the data input terminal and the first node, and may have a gate electrode connected to the data input terminal.

The first buffer circuit may further include a third variable resistor circuit and a fourth variable resistor circuit. The third variable resistor circuit may be serially connected to the first variable resistor circuit along the data path, may have a third resistance varied based on the plurality of control signals, and may adjust a voltage level of an output signal of the first variable resistor circuit based on the third resistance. The fourth variable resistor circuit may be serially connected to the second variable resistor circuit along the reference voltage path, may have a fourth resistance varied based on the plurality of control signals, and may adjust a voltage level of an output signal of the second variable resistor circuit based on the fourth resistance.

The first buffer circuit may further include a first electrostatic discharge (ESD) protection circuit and a second ESD protection circuit. The first ESD protection circuit may be connected to an output of the first variable resistor circuit, and may reduce high voltage components of the input data signal. The second ESD protection circuit may be connected to an output of the second variable resistor circuit, and may reduce high voltage components of the reference voltage.

The data receiver may further include a control circuit. The control circuit may generate the plurality of control signals based on a plurality of program signals. The control circuit may include a plurality of fuse cells that are programmable in response to the plurality of program signals, and generate the control signals based on a programmed state of the plurality of fuse cells.

The data receiver may further include a control circuit. The control circuit may generate the plurality of control signals based on a plurality of address signals. The control circuit may include a logic circuit that performs a logic operation on a mode register set signal and the input data signal to generate the plurality of control signals. The mode register set signal may be generated based on the plurality of address signals.

In further embodiment, a semiconductor device includes a control circuit, a first buffer circuit and a second buffer circuit. The control circuit generates a plurality of control signals. The first buffer circuit includes a first variable resistor circuit and a second variable resistor circuit. The first variable resistor circuit includes a first plurality of resistors to generate a first variable resistance. The first variable resistor circuit is configured to receive an input signal and to pass the input signal through the first variable resistance to generate a first internal signal in response to at least one of the control signals. The second variable resistor circuit includes a second plurality of resistors to generate a second variable resistance.

The second variable resistor circuit is configured to receive a reference voltage and to pass the reference voltage through the second variable resistance in response to at least one of the control signals to generate a first internal reference voltage. The second buffer circuit is configured to receive the first internal signal and the first internal reference voltage to generate an output signal.

The plurality of control signals may be generated based on a plurality of program signals or a plurality of address signals.

The semiconductor device may be one of a data input buffer, an address buffer, a command buffer, a control buffer and a clock buffer.

The second buffer circuit may comprise a latch having an output of the output signal.

The first variable resistor circuit may comprise a plurality of first circuit parts connected in parallel between a first node, connected to receive the input signal, and a second node, connected to output the first internal signal. The second variable resistor circuit may comprise a plurality of second circuit parts connected in parallel between a third node, connected to receive the reference voltage, and a fourth node, connected to output the first internal reference voltage. Each of the first circuit parts and second circuit parts may comprise a resistor and a switch connected in series. The switch may be responsive to at least one of the plurality of control signals.

In another embodiment, a memory device includes an input terminal and a buffer circuit. The input terminal receives an input signal external to the memory device. The buffer circuit includes a first buffer circuit, a second buffer circuit and a control circuit. The first buffer circuit includes a plurality of resistors to generate a variable resistance. The first buffer circuit is connected to the first input terminal and configured to receive the input signal and output an internal signal through the variable resistance in response to at least one control signal. The second buffer circuit is configured to receive the internal signal and to generate an output signal. The control circuit is configured to generate the at least one control signal to select the variable resistance.

The memory device may further include a control input terminal to receive a control input signal external to the memory device. The first buffer circuit may further include a plurality of resistors to generate a second variable resistance. The first buffer circuit may be connected to the control input terminal and may be configured to receive the control input signal and output an internal control signal through the second variable resistance in response to the plurality of control signals.

In another embodiment, a memory module includes a module board and a plurality of semiconductor memory devices. The plurality of semiconductor memory devices are mounted on the module board. Each of the plurality of semiconductor memory devices includes a buffer (e.g. a data input buffer, an address buffer, a command buffer, a control buffer, a clock buffer etc.) and a memory cell array. The data input buffer has a data receiver that varies a resistance of a data path and a resistance of a reference voltage path based on a plurality of control signals, adjusts a voltage level of an input data signal and a level of a reference voltage based on the varied resistance of the data path and the varied resistance of the reference voltage path, and compares the input data signal with the reference voltage to generate a data signal. The memory cell array stores the data signal and outputs stored data.

At least two of memory devices may have a variable resistance different from each other.

Accordingly, in the data receiver according to some example embodiments, the first buffer circuit varies the resistance of the data path and the resistance of the reference voltage path, and adjusts the voltage level of the input data signal DIN and the level of the reference voltage VREF based on the varied resistance of the data path and the varied resistance of the reference voltage path. Thus, the data receiver according to some example embodiments may effectively reduce the ringback noise and may have relatively improved signal integrity.

BRIEF DESCRIPTION OF THE DRAWINGS

Illustrative, non-limiting example embodiments will be more clearly understood from the following detailed description taken in conjunction with the accompanying drawings.

FIG. 10 is a block diagram illustrating a semiconductor memory device according to an exemplary embodiment.

FIG. 13 is a block diagram illustrating a memory module according to an exemplary embodiment.

DETAILED DESCRIPTION OF THE EMBODIMENTS

Figure 1A:
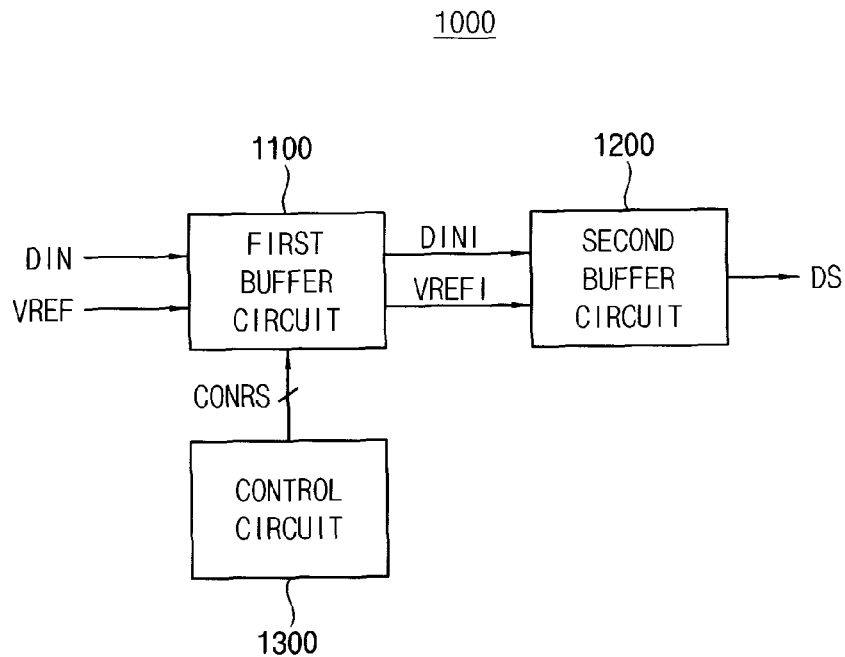
FIG. 1A is a block diagram illustrating a data receiver according to an exemplary embodiment.

Various example embodiments will be described more fully with reference to the accompanying drawings, in which embodiments are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like reference numerals refer to like circuits throughout this application.

It will be understood that, although the terms first, second, etc. may be used herein to describe various circuits, these circuits should not be limited by these terms. These terms are used to distinguish one circuit from another. For example, a first circuit could be termed a second circuit, and, similarly, a second circuit could be termed a first circuit, without departing from the scope of the inventive concept. As used herein, the term "and/or" includes any and all combinations of one or more of the associated listed items.

It will be understood that when a circuit is referred to as being "connected" or "coupled" to another circuit, it can be directly connected or coupled to the other circuit or intervening circuits may be present. In contrast, when a circuit is referred to as being "directly connected" or "directly coupled" to another circuit, there are no intervening circuits present. Other words used to describe the relationship between circuits should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, circuits, and/or components, but do not preclude the presence or addition of one or more other Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1A is a block diagram illustrating a data receiver according to an exemplary embodiment.

Referring to FIG. 1A, the data receiver 1000 includes a first buffer circuit 1100 and a second buffer circuit 1200. The data receiver 1000 may further include a control circuit 1300.

The data receiver 1000 may be part of a semiconductor memory device and/or a semiconductor integrated circuit chip. The data receiver 1000 may receive data signals to determine logic levels of the received data signals and may provide the received data signals to a memory cell array (not illustrated) included in the semiconductor memory device.

The first buffer circuit 1100 varies a resistance of a data path and a resistance of a reference voltage path based on a plurality of control signals CONRS, and adjusts a voltage level of an input data signal DIN and a level of a reference voltage VREF to generate an internal data signal DINI and an internal reference voltage VREFI based on the varied resistance of the data path and the varied resistance of the reference voltage path.

Hereinafter, the data path indicates a path that is included in the first buffer circuit 1100 and is formed from a data input terminal receiving the input data signal DIN to an internal data output terminal outputting the internal data signal DINI. The reference voltage path indicates a path that is included in the first buffer circuit 1100 and is formed from a reference voltage input terminal receiving the reference voltage VREF to an internal reference voltage output terminal outputting the internal reference voltage VREFI.

The first buffer circuit 1100 may adjust the voltage level of the input data signal DIN and the level of the reference voltage VREF for reducing ringback noise that may be caused while receiving data in the semiconductor memory device. The first buffer circuit 1100 may include at least one variable resistor for varying the resistance of the data path and/or the resistance of the reference voltage path.

The first buffer circuit 1100 may receive the input data signal DIN from an external device (not illustrated) such as a memory controller. The first buffer circuit 1100 may receive the reference voltage VREF from an external device (not illustrated) such as a voltage generator. The first buffer circuit 1100 may receive the plurality of control signals CONRS from the control circuit 1300. In an example embodiment, the plurality of control signals CONRS may be received from the memory controller.

In an example embodiment, the first buffer circuit 1100 may reduce high voltage components of the input data signal DIN and high voltage components of the reference voltage VREF. When high voltage components and/or high current components due to electrostatic discharge (ESD) are momentarily applied to input/output (I/O) pad e.g., the data input terminal and/or the reference voltage input terminal, if the high voltage components and/or high current components are transferred to the second buffer circuit 1200 or the memory cell array through the I/O pad, a gate oxide or a p-n junctions included in transistors of the second buffer circuit 1200 or the memory cell array may be damaged, and thus overall operations, durability, and reliability of the second buffer circuit 1200 or the memory cell array may be degraded. The first buffer circuit 1100 may include at least one ESD protection circuit for preventing deterioration or damage of the transistors included in the semiconductor memory device.

The second buffer circuit 1200 compares the internal data signal DINI with the internal reference voltage VREFI to generate a data signal. For example, the second buffer circuit 1200 may compare the internal data signal DINI with the internal reference voltage VREFI to sense a voltage difference between the internal data signal DINI and the internal reference voltage VREFI, and may amplify the voltage difference to generate a data signal DS. The second buffer circuit 1200 may provide the data signal DS to the memory cell array. The data signal DS may be latched by using a latch circuit (not shown). The second buffer circuit 1200 may be implemented with various structures according to some example embodiments.

The control circuit 1300 may generate the plurality of control signals CONRS. In an example embodiment, the control circuit 1300 may include a plurality of fuse cells and may generate the plurality of control signals CONRS based on a plurality of program signals. In another example embodiment, the control circuit 1300 may include a logic circuit and may generate the plurality of control signals CONRS based on a plurality of address signals.

Various methods have been used for reducing the ringback noise in a semiconductor memory device. For example, a method of changing lengths or structures of transmission lines, a method of varying resistances of termination resistors and a method of changing operational characteristics of I/O drivers have been used for reducing the ringback noise. However, when such methods are adopted in the conventional semiconductor memory device, the characteristics with respect to the receiving data e.g., a setup time, a hold time and a slew rate, may be degraded and thus the overall performance of the semiconductor memory device may be degraded.

In the data receiver 1000 according to an exemplary embodiment, the first buffer circuit varies the resistance of the data path and the resistance of the reference voltage path, and adjusts the voltage level of the input data signal DIN and the level of the reference voltage VREF based on the varied resistance of the data path and the varied resistance of the reference voltage path. Thus, the data receiver 1000 according to some example embodiments and the semiconductor memory device including the data receiver may effectively reduce the ringback noise without degrading the characteristics with respect to the receiving data and may have relatively improved signal integrity.

Figure 1B:
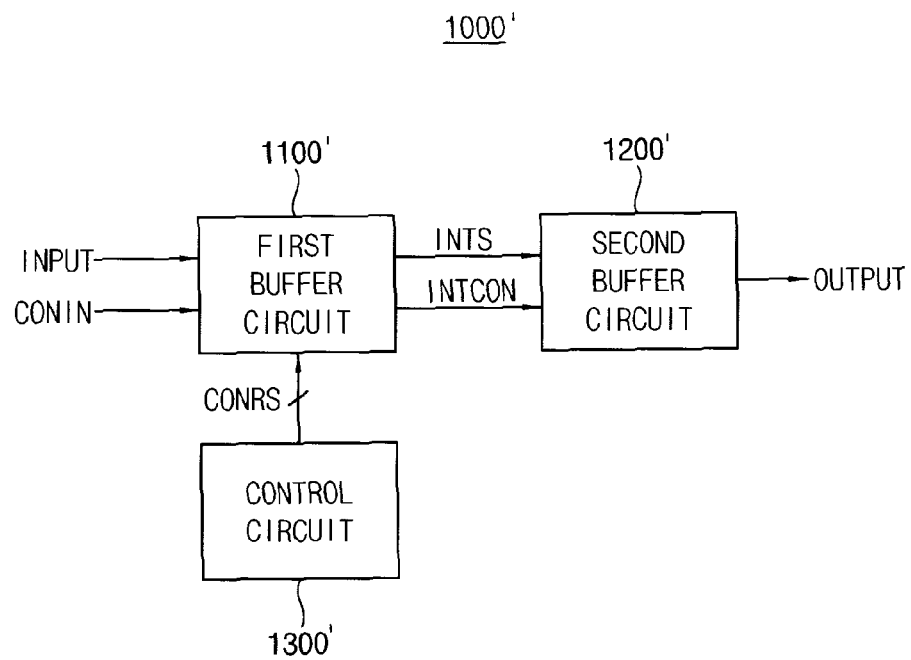
FIG. 1B is a block diagram illustrating a buffer according to an exemplary embodiment.

FIG. 1B is a block diagram illustrating a buffer according to an exemplary embodiment.

Referring to FIG. 1B, the buffer circuit 1000' includes a first buffer circuit 1100' and a second buffer circuit 1200'. The buffer circuit 1000' may further include a control circuit 1300'.

The buffer circuit 1000' may be part of a semiconductor memory device and/or a semiconductor integrated circuit chip. The buffer circuit 1000' may receive input signal to determine logic levels of the received input signal and may provide the received input signal to a various internal circuit (not illustrated) included in the semiconductor memory device.

The first buffer circuit 1100' varies a resistance of a signal path and a resistance of a control signal path based on a plurality of control signals CONRS, and adjusts a voltage level of an input signal INPUT and a voltage level of a input control signal CONIN to generate an internal signal INTS and an internal control signal INTCON based on the varied resistance of the signal path and the varied resistance of the control signal path.

Hereinafter, the signal path indicates a path that is included in the first buffer circuit 1100' and is formed from an input signal terminal receiving the input signal INPUT to an internal signal output terminal outputting the internal signal INTS. The control signal path indicates a path that is included in the first buffer circuit 1100' and is formed from a control signal input terminal receiving the input control signal CONIN to an internal control signal output terminal outputting the internal control signal INTCON.

The first buffer circuit 1100' may adjust the voltage level of the input signal INPUT and the level of the input control signal CONIN for reducing ringback noise that may be caused while receiving signal in the semiconductor memory device. The first buffer circuit 1100' may include at least one variable resistor for varying the resistance of the signal path and/or the resistance of the control signal path.

The first buffer circuit 1100' may receive the input signal INPUT from an external device (not illustrated) such as a memory controller. The first buffer circuit 1100' may receive the input control signal CONIN from an external device (not illustrated) such as a control signal generator. The first buffer circuit 1100' may receive the plurality of control signals CONRS from the control circuit 1300'. In an example embodiment, the plurality of control signals CONRS may be received from the memory controller.

The first buffer circuit 1100' may include a first variable resistor circuit and a second variable resistor circuit. The first variable resistor circuit may include a first plurality of resistors to generate a first variable resistance corresponding to the resistance of the signal path. The first variable resistor circuit may be configured to receive the input signal INPUT and to pass the input signal INPUT through the first variable resistance to generate the internal signal INTS in response to at least one of the control signals CONRS. The second variable resistor circuit may include a second plurality of resistors to generate a second variable resistance corresponding to the resistance of the control signal path. The second variable resistor circuit may be configured to receive the input control signal CONIN and to pass the input control signal CONIN through the second variable resistance to generate the internal control signal INTCON in response to at least one of the control signals CONRS.

In an example embodiment, the first buffer circuit 1100' may reduce high voltage components of the input signal INPUT and high voltage components of the input control signal CONIN. When high voltage components and/or high current components due to electrostatic discharge (ESD) are momentarily applied to a pad e.g., the input signal terminal and/or the control signal input terminal, if the high voltage components and/or high current components are transferred to the second buffer circuit 1200' or the internal circuit through the pad, a gate oxide or a p-n junctions included in transistors of the second buffer circuit 1200' or the internal circuit may be damaged, and thus overall operations, durability, and reliability of the second buffer circuit 1200' or the internal circuit may be degraded. The first buffer circuit 1100' may include at least one ESD protection circuit for preventing deterioration or damage of the transistors included in the semiconductor memory device.

The second buffer circuit 1200' receives the internal signal INTS and the internal control signal INTCON to generate an output signal OUTPUT. For example, the second buffer circuit 1200' may input the internal signal INTS and transmit the internal signal INTS as an output signal OUTPUT based on the internal control signal INTCON which has either logic high or logic low. The second buffer circuit 1200' may provide the output signal OUTPUT to various internal circuits in the semiconductor memory device. The second buffer circuit 1200' may comprise a latch having an output of the output signal. The output signal OUTPUT may be latched by using a latch circuit (not shown). The second buffer circuit 1200' may be implemented with various structures according to some example embodiments.

The control circuit 1300' may generate the plurality of control signals CONRS. The plurality of control signals CONRS may be generated based on a plurality of program signals or a plurality of address signals. The control circuit 1300 of FIG. 1A may have substantially the same structure as the control circuit 1300' of FIG. 1B. For convenience, an illustration of the control circuit 1300' will be omitted.

In the buffer circuit 1000' according to an exemplary embodiment, the first buffer circuit varies the resistance of the signal path and the resistance of the control signal path, and adjusts the voltage level of the input signal INPUT and the level of the input control signal CONIN based on the varied resistance of the signal path and the varied resistance of the control signal path. Thus, the buffer 1000' according to some example embodiments and the semiconductor memory device including the buffer may effectively reduce the ringback noise without degrading the characteristics with respect to the receiving signal and may have relatively improved signal integrity.

The buffer circuit may include an address buffer, a command buffer, a clock buffer and a control buffer.

Figure 2:
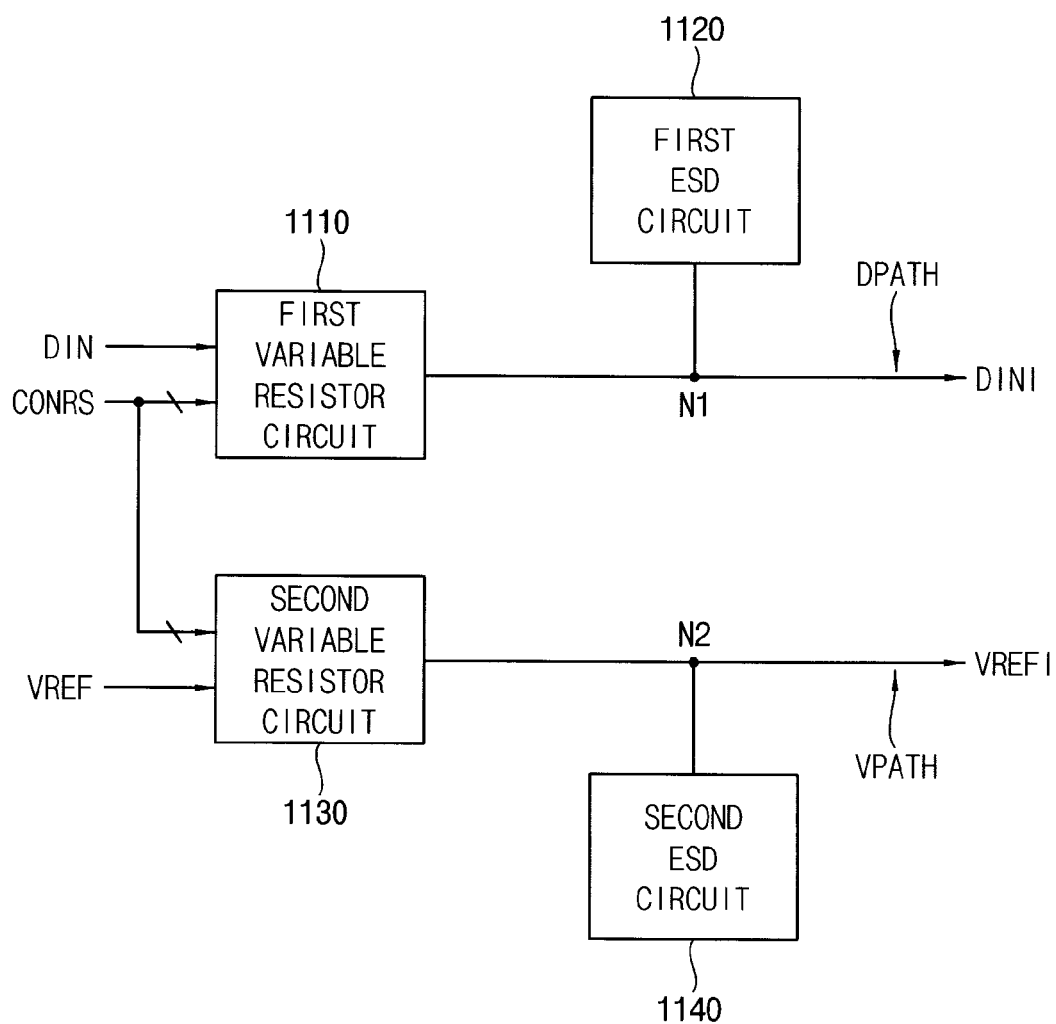
FIG. 2 is a block diagram illustrating an example of a first buffer circuit included in the data receiver of FIG. 1A.

FIG. 2 is a block diagram illustrating an example of the first buffer circuit included in the data receiver of FIG. 1A.

Referring to FIG. 2, the first buffer circuit 1100a may include a first variable resistor circuit 1110, a first ESD protection circuit 1120, a second variable resistor circuit 1130 and a second ESD protection circuit 1140.

The first variable resistor circuit 1110 may receive the input data signal DIN and the plurality of the control signals CONRS. The first variable resistor circuit 1110 may form a portion of the data path DPATH. For example, the first variable resistor circuit 1110 may be connected between the data input terminal receiving the input data signal DIN and a first node N1 that is located on the data path DPATH. The first variable resistor circuit 1110 may have a first resistance that is varied based on the plurality of control signals CONRS. The first resistance may correspond to the resistance of the data path DPATH. The first variable resistor circuit 1110 may adjust the voltage level of the input data signal DIN based on the first resistance.

The first ESD protection circuit 1120 may be connected to an output (i.e., the first node N1) of the first variable resistor circuit 1110. The first ESD protection circuit 1120 may reduce high voltage components of the input data signal DIN. The first buffer circuit 1100a may adjust the voltage level of the input data signal DIN by using the first variable resistor circuit 1110, may reduce the high voltage components of the input data signal DIN by using the first ESD protection circuit 1120, and thus may generate the internal data signal DINI.

The second variable resistor circuit 1130 may receive the reference voltage VREF and the plurality of the control signals CONRS. The second variable resistor circuit 1130 may form a portion of the reference voltage path VPATH. For example, the second variable resistor circuit 1130 may be connected between the reference voltage input terminal receiving the reference voltage VREF and a second node N2 that is located on the reference voltage path VPATH. The second variable resistor circuit 1130 may have a second resistance that is varied based on the plurality of control signals CONRS. The second resistance may correspond to the resistance of the reference voltage path VPATH. The second variable resistor circuit 1130 may adjust the level of the reference voltage VREF based on the second resistance.

The second ESD protection circuit 1140 may be connected to an output (i.e., the second node N2) of the second variable resistor circuit 1130. The second ESD protection circuit 1140 may reduce high voltage components of the reference voltage VREF. The first buffer circuit 1100a may adjust the level of the reference voltage VREF by using the second variable resistor circuit 1130, may reduce the high voltage components of the reference voltage VREF by using the second ESD protection circuit 1140, and thus may generate the internal reference voltage VREFI.

In an example embodiment, the first variable resistor circuit 1110 and the second variable resistor circuit 1130 may include a plurality of variable resistors. For example, the first variable resistor circuit 1110 and the second variable resistor circuit 1130 may include a plurality of resistor circuit parts that have an active resistor.

Figure 3:
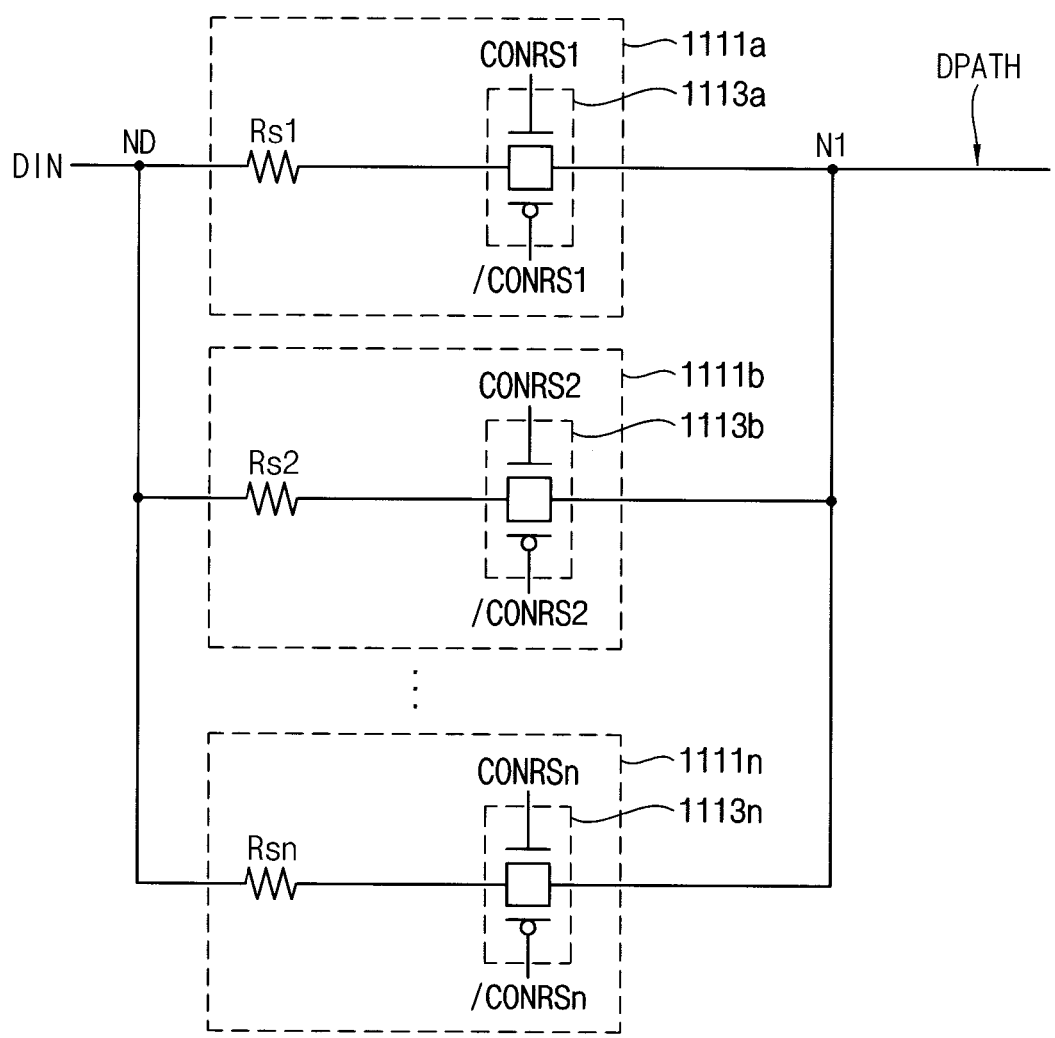
FIG. 3 is a circuit diagram illustrating an example of a first variable resistor circuit included in the first buffer circuit of FIG. 2.

FIG. 3 is a circuit diagram illustrating an example of the first variable resistor circuit included in the first buffer circuit of FIG. 2.

Referring to FIG. 3, the first variable resistor circuit 1110a may include a plurality of resistor circuit parts. The plurality of resistor circuit parts may include first through n-th resistor circuit parts 1111a, 1111b, ..., 1111n, where n is a natural number equal to or greater than two.

The plurality of resistor circuit parts 1111a, 1111b, ..., 1111n may be connected in parallel between a data input node ND and the first node N1. The data input node ND may correspond to the data input terminal. Each of the plurality of resistor circuit parts 1111a, 1111b, ..., 1111n may include a respective one of a plurality of resistors Rs1, Rs2, ..., Rsn and a respective one of a plurality of switches 1113a, 1113b, ..., 1113n (e.g. transmission gates). Each of the plurality of resistors Rs1, Rs2, ..., Rsn may be connected to the data input node ND. Each of the plurality of transmission gates 1113a, 1113b, ..., 1113n may be connected between the respective one of the plurality of resistors Rs1, Rs2, ..., Rsn and the first node N1, and may operate in response to one of the plurality of the control signals that include first through n-th control signals CONRS1, CONRS2, ..., CONRSn. For example, a first resistor circuit part 1111a may include a first resistor Rs1 connected to the data input node ND and a first transmission gate 1113a connected between the first resistor Rs1 and the first node N1. That is, the first resistor circuit part 1111a and the first transmission gate 1113a may be connected in serial between the data input node ND and the first node N1. The first transmission gate 1113a may operate in response to the first control signal CONRS1.

Each of the plurality of transmission gates 1113a, 1113b, ..., 1113n may include a respective one of a plurality of p-type metal oxide semiconductor (PMOS) transistors and a respective one of a plurality of n-type metal oxide semiconductor (NMOS) transistors. Each of the plurality of NMOS transistors may have a gate electrode receiving a respective one of the control signals CONRS1, CONRS2, ..., CONRSn. Each of the plurality of PMOS transistors may have a gate electrode receiving a respective one of inverted control signals /CONRS1, /CONRS2, ..., /CONRSn. For example, the first transmission gate 1113a may include a first NMOS transistor that has a gate electrode receiving the first control signal CONRS1 and a first PMOS transistor that has a gate electrode receiving an inverted first control signal /CONRS1.

Each of the plurality of resistors Rs1, Rs2, ..., Rsn may be electrically connected between the data input node ND and the first node N1 based on the respective one of the control signals CONRS1, CONRS2, ..., CONRSn, and thus the first resistance of the first variable resistor circuit 1110a may be varied. For example, when the control signal CONRS1 has a logic high level and the control signals CONRS2, ..., CONRSn also have a logic high level, the transmission gate 1113a may be turned on and the transmission gates 1113b, ..., 1113n also may be turned on, the first resistor Rs1 may be electrically connected between the data input terminal ND and the first node N1, and thus the first resistance may be decreased. When the first control signal CONRS1 has a logic low level and the control signals CONRS2, ..., CONRSn have a logic high level, the first transmission gate 1113a may be turned off and the transmission gates 1113b, ..., 1113n may be turned on, the first resistor Rs1 may be electrically disconnected between the data input terminal ND and the first node N1, and thus the first resistance may be increased. In an example embodiment, the first resistance corresponding to the resistance of the data path DPATH may have in a range of about 200Ω to 330Ω.

In an example embodiment, each of the plurality of resistors Rs1, Rs2, ..., Rsn may have a resistance that is different from each other. The first resistance may correspond to one of the various numbers (e.g., $2^n$) of resistances that is determined depending on a combination of the logic levels of the control signals CONRS1, CONRS2, ..., CONRSn. In another example embodiment, each of the plurality of resistors Rs1, Rs2, ..., Rsn may have the same resistance. The first resistance may correspond to one of the various numbers (e.g., n) of resistances that is determined depending on the combination of the logic levels of the control signals CONRS1, CONRS2, ..., CONRSn.

The first resistor circuit part may include a first PMOS transistor receiving the inverted first control signal CONRS1 and a first NMOS transistor receiving the first control signal /CONRS1, according to an exemplary embodiment.

Although the first variable resistor circuit 1110a is illustrated in FIG. 3 for convenience of illustration, the second variable resistor circuit 1130 included in the first buffer circuit 1100a of FIG. 2 may have substantially the same structure as the first variable resistor circuit 1110a of FIG. 3. For example, the second variable resistor circuit 1130 may include a plurality of resistor circuit parts that are connected in parallel between the reference voltage input terminal and the second node N2. Each of the plurality of resistor circuit parts included in the second variable resistor circuit 1130 may include a resistor and a transmission gate. The second resistance corresponding to the resistance of the reference voltage path VPATH may have in a range of about 200Ω to 330Ω.

Figure 4:
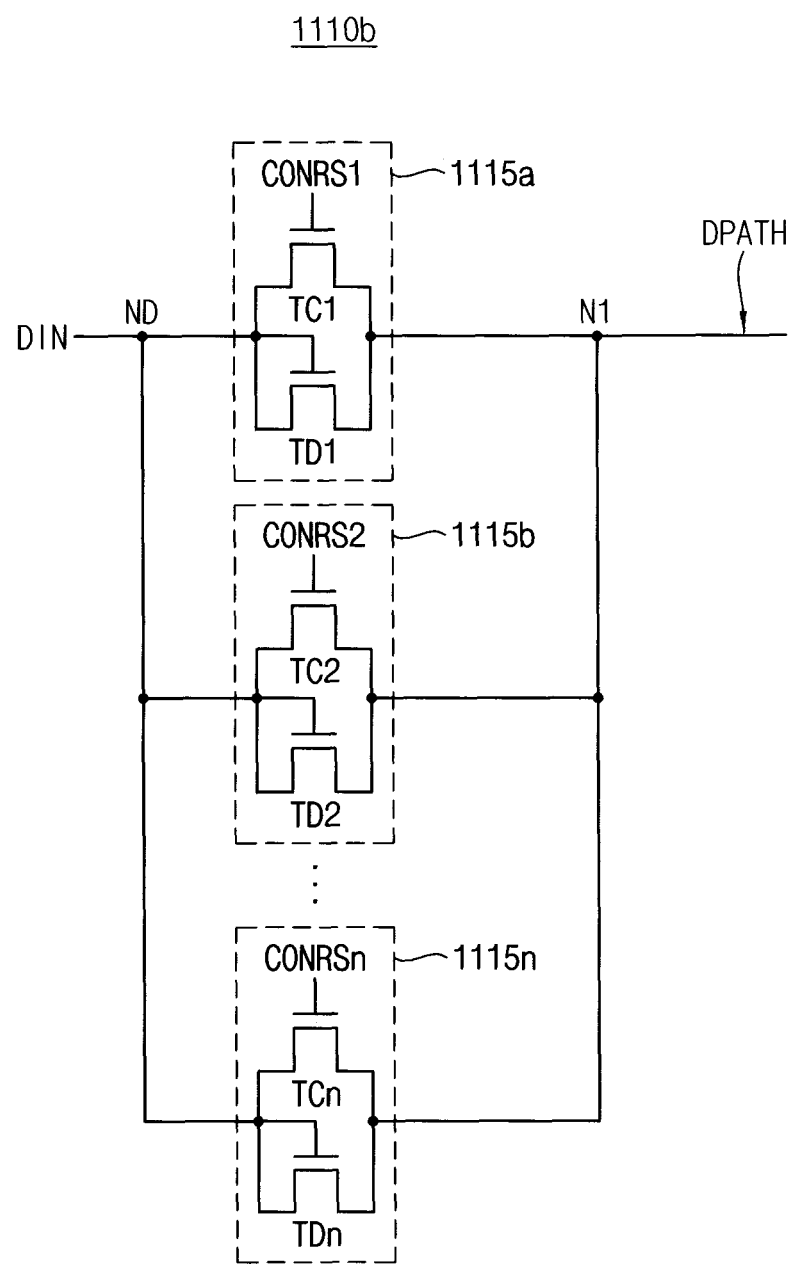
FIG. 4 is a circuit diagram illustrating another example of the first variable resistor circuit included in the first buffer circuit of FIG. 2.

FIG. 4 is a circuit diagram illustrating another example of the first variable resistor circuit included in the first buffer circuit of FIG. 2.

Referring to FIG. 4, the first variable resistor circuit 1110b may include a plurality of resistor circuit parts. The plurality of resistor circuit parts may include first through n-th resistor circuit parts 1115a, 1115b, ..., 1115n.

The plurality of resistor circuit parts 1115a, 1115b, ..., 1115n may be connected in parallel between the data input node ND corresponding to the data input terminal and the first node N1. Each of the plurality of resistor circuit parts 1115a, 1115b, ..., 1115n may include a respective one of a plurality of switches TC1, TC2, ..., TCn (e.g. control transistors) and a respective one of a plurality of diode transistors TD1, TD2, ..., TDn. Each of the plurality of control transistors TC1, TC2, ..., TCn may be connected between the data input node ND and the first node N1 and may have a gate electrode receiving a respective one of the control signals CONRS1, CONRS2, ..., CONRSn. Each of the plurality of diode transistors TD1, TD2, ..., TDn may be connected between the data input node ND and the first node N1 and may have a gate electrode connected to the data input node ND. For example, the first resistor circuit part 1115a may include a first control transistor TC1 and a first diode transistor TD1. The first control transistor TC1 may be connected between the data input node ND and the first node N1 and may have a gate electrode receiving the first control signal CONRS1. The first diode transistor TD1 may be connected in parallel with the first control transistor TC1 between the data input node ND and the first node N1, and may have a gate electrode connected to the data input node ND. That is, a first electrode (e.g., drain) of the first diode transistor TD1 and the gate electrode of the first diode transistor TD1 may be electrically connected to each other. The first diode transistor TD1 may be implemented in a form of a diode.

Each of the plurality of control transistors TC1, TC2, ..., TCn may be electrically connected between the data input node ND and the first node N1 based on the respective one of the control signals CONRS1, CONRS2, ..., CONRSn, and thus the first resistance of the first variable resistor circuit 1110b may be varied. For example, when the control signal CONRS1 has the logic high level and the control signals CONRS2, ..., CONRSn also have a logic high level, the control transistor TC1 may be turned on and the control transistors TC2, ..., TCn also may be turned on, and the first resistance may be decreased. When the first control signal CONRS1 has the logic low level and the control signals CONRS2, ..., CONRSn have a logic high level, the first transmission gate 1113a may be turned off and the control transistors TC2, ..., TCn may be turned on, and the first resistance may be increased. In an example embodiment, the first resistance corresponding to the resistance of the data path DPATH may have in a range of about 200Ω to 330Ω.

In an example embodiment, each of the plurality of diode transistors TD1, TD2, ..., TDn may have a size that is different from each other. The first resistance may correspond to one of the various numbers (e.g., $2^n$) of resistances that is determined depending on the combination of the logic levels of the control signals CONRS1, CONRS2, ..., CONRSn. In another example embodiment, each of the plurality of diode transistors TD1, TD2, ..., TDn may have the same size. The first resistance may correspond to one of the various numbers (e.g., n) of resistances that is determined depending on the combination of the logic levels of the control signals CONRS1, CONRS2, ..., CONRSn.

The NMOS transistors TC1 and TD1 included in the first resistor circuit 1115a may be replaced with PMOS transistors, according to an exemplary embodiment.

Although the first variable resistor circuit 1110b is illustrated in FIG. 4 for convenience of illustration, the second variable resistor circuit 1130 included in the first buffer circuit 1100a of FIG. 2 may have substantially the same structure as the first variable resistor circuit 1110b of FIG. 4. For example, the second variable resistor circuit 1130 may include a plurality of resistor circuit parts that are connected in parallel between the reference voltage input terminal and the second node N2. Each of the plurality of resistor circuit parts included in the second variable resistor circuit 1130 may include a control transistor and a diode transistor. The second resistance corresponding to the resistance of the reference voltage path VPATH may have in a range of about 200Ω to 330Ω.

Figure 5:
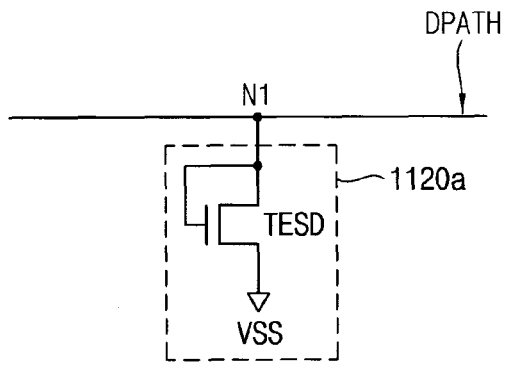
FIG. 5 is a circuit diagram illustrating an example of a first ESD protection circuit included in the first buffer circuit of FIG. 2.

FIG. 5 is a circuit diagram illustrating an example of a first ESD protection circuit included in the first buffer circuit of FIG. 2.

Referring to FIG. 5, the first ESD protection circuit 1120a may include an ESD protection transistor TESD.

The ESD protection transistor TESD may have a first electrode (e.g., drain) connected to the output (i.e., the first node N1) of the first variable resistor circuit 1110, a gate electrode electrically connected to the first electrode, and a second electrode (e.g., source) connected to a ground voltage VSS. The ESD protection transistor TESD may be implemented in the form of the diode. In an example embodiment, the ESD protection transistor TESD may be designed by using charge device model (CDM), which models a capacitor that is charged and discharged when it touches a grounded metal surface.

Although the first ESD protection circuit 1120a is illustrated in FIG. 5 for convenience of illustration, the second ESD protection circuit 1140 included in the first buffer circuit 1100a of FIG. 2 may have substantially the same structure as the first ESD protection circuit 1120a of FIG. 5. For example, the second ESD protection circuit 1140 may include an ESD protection transistor that has a first electrode connected to the output (i.e., the second node N2) of the second variable resistor circuit 1130, a gate electrode electrically connected to the first electrode, and a second electrode connected to the ground voltage VSS.

Figure 6:
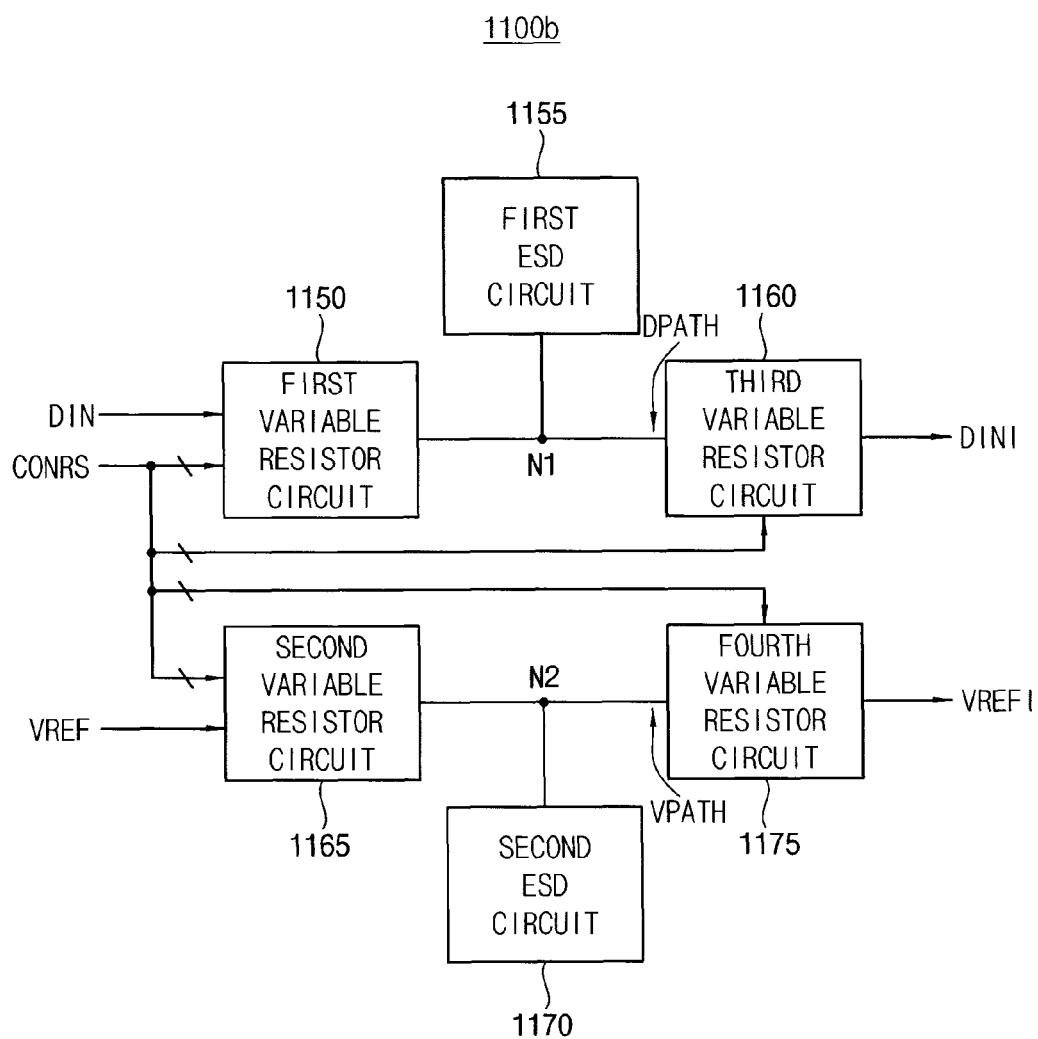
FIG. 6 is a block diagram illustrating another example of the first buffer circuit included in the data receiver of FIG. 1A.

FIG. 6 is a block diagram illustrating another example of the first buffer circuit included in the data receiver of FIG. 1A.

Referring to FIG. 6, the first buffer circuit 1100b may include a first variable resistor circuit 1150, a second variable resistor circuit 1165, a third variable resistor circuit 1160, a fourth variable resistor circuit 1175, a first ESD protection circuit 1155 and a second ESD protection circuit 1170.

The first variable resistor circuit 1150, the second variable resistor circuit 1165, the first ESD protection circuit 1155 and the second ESD protection circuit 1170 in FIG. 6 may be substantially the same as the first variable resistor circuit 1110, the second variable resistor circuit 1130, the first ESD protection circuit 1120 and the second ESD protection circuit 1140 in FIG. 2, respectively. The first variable resistor circuit 1150 may have a first resistance that is varied based on the plurality of control signals CONRS and may adjust the voltage level of the input data signal DIN based on the first resistance. The first ESD protection circuit 1155 may reduce high voltage components of the input data signal DIN. The second variable resistor circuit 1165 may have a second resistance that is varied based on the plurality of control signals CONRS and may adjust the level of the reference voltage VREF based on the second resistance. The second ESD protection circuit 1170 may reduce high voltage components of the reference voltage VREF.

The third variable resistor circuit 1160 may be serially connected to the first variable resistor circuit 1150 along the data path DPATH. For example, the third variable resistor circuit 1160 may be connected between the output (i.e., the first node N1) of the first variable resistor circuit 1150 and the internal data output terminal outputting the internal data signal DINI. The first and third variable resistor circuit parts 1150 and 1160 may be serially located along the data path DPATH. The third variable resistor circuit 1160 may have a third resistance that is varied based on the plurality of control signals CONRS and may adjust a voltage level of an output signal of the first variable resistor circuit 1150 based on the third resistance.

The fourth variable resistor circuit 1175 may be serially connected to the second variable resistor circuit 1165 along the reference voltage path VPATH. For example, the fourth variable resistor circuit 1175 may be connected between the output (i.e., the second node N2) of the second variable resistor circuit 1165 and the internal reference voltage output terminal outputting the internal reference voltage VREFI. The second and fourth variable resistor circuit parts 1165 and 1175 may be serially located along the reference voltage path VPATH. The fourth variable resistor circuit 1175 may have a fourth resistance that is varied based on the plurality of control signals CONRS and may adjust a voltage level of an output signal of the second variable resistor circuit 1165 based on the fourth resistance.

The third and fourth variable resistor circuit parts 1160 and 1175 may have substantially the same structure as one of the first variable resistor circuit 1110a of FIG. 3 and the first variable resistor circuit 1110b of FIG. 4. For example, the third variable resistor circuit 1160 may include a plurality of third resistor circuit parts that are connected in parallel between the first node N1 and the internal data output terminal. The fourth variable resistor circuit 1175 may include a plurality of fourth resistor circuit parts that are connected in parallel between the second node N2 and the internal reference voltage output terminal. Each of the third and fourth resistor circuit parts may be implemented with a resistor and a transmission gate, or a control transistor and a diode transistor.

In an example embodiment, a sum of the first resistance and the third resistance may correspond to the resistance of the data path DPATH. The sum of the first resistance and the third resistance may have in a range of about 200Ω to 330Ω. A sum of the second resistance and the fourth resistance may correspond to the resistance of the reference voltage path VPATH. The sum of the second resistance and the fourth resistance may have in a range of about 200Ω to 330Ω.

The first buffer circuit 1100b may adjust the voltage level of the input data signal DIN by using the first and third variable resistor circuit 1150 and 1160, may reduce the high voltage components of the input data signal DIN by using the first ESD protection circuit 1155, and thus may generate the internal data signal DINI. The first buffer circuit 1100b may adjust the level of the reference voltage VREF by using the second and fourth variable resistor circuit 1165 and 1175, may reduce the high voltage components of the reference voltage VREF by using the second ESD protection circuit 1170, and thus may generate the internal reference voltage VREFI.

Figure 7:
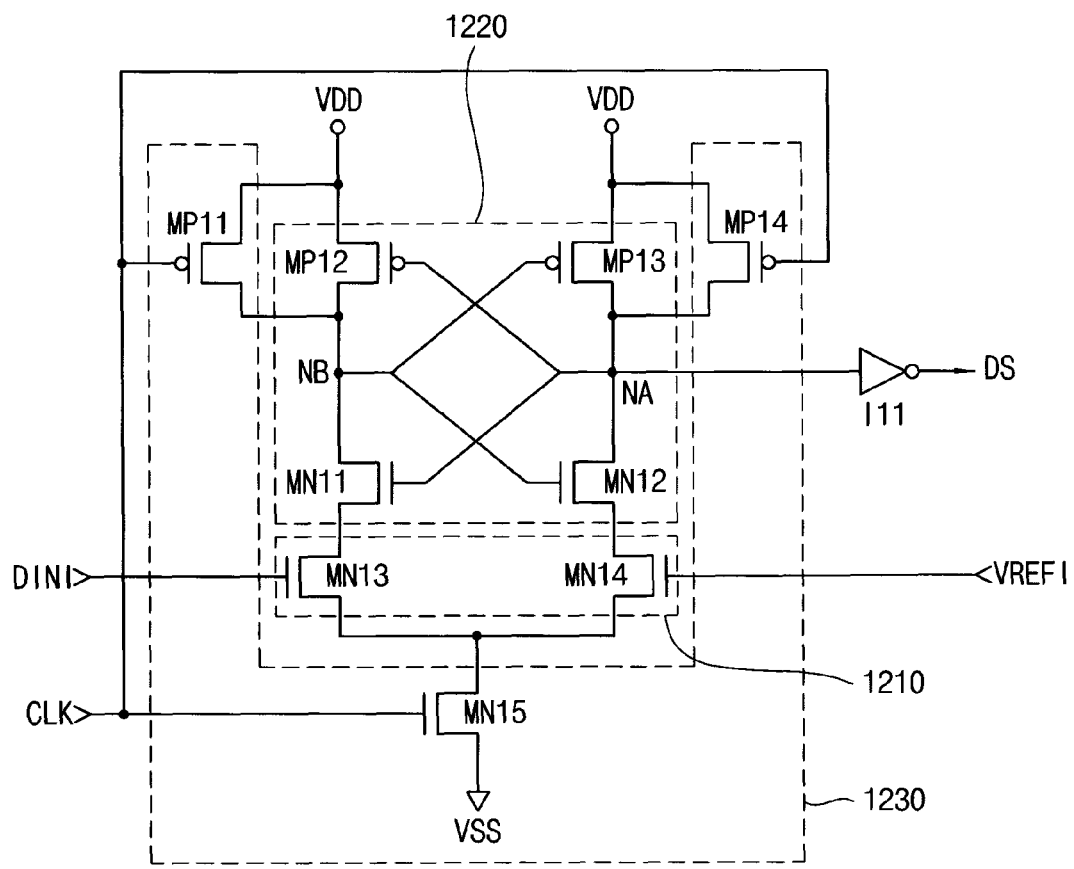
FIG. 7 is a circuit diagram illustrating an example of a second buffer circuit included in the data receiver of FIG. 1A.

FIG. 7 is a circuit diagram illustrating an example of the second buffer circuit included in the data receiver of FIG. 1A.

Referring to FIG. 7, the second buffer circuit 1200a may include a receiving block 1210, an amplification block 1220 and a control block 1230, and may further include an inverter I11.

The receiving block 1210 may receive the internal data signal DINI and the internal reference voltage VREFI. The receiving block 1210 may include a first input transistor MN13 and a second input transistor MN14. The first input transistor MN13 may have a gate electrode receiving the internal data signal DINI. The second input transistor MN14 may have a gate electrode receiving the internal reference voltage VREFI.

The amplification block 1220 may compare the internal data signal DINI with the internal reference voltage VREFI to sense the voltage difference between the internal data signal DINI and the internal reference voltage VREFI, and may amplify the voltage difference. The amplification block 1220 may include NMOS transistors MN11 and MN12 and PMOS transistors MP12 and MP13. The PMOS transistor MP12 may have a gate electrode connected to a first node NA and may be connected between a power supply voltage VDD and a second node NB. The PMOS transistor MP13 may have a gate electrode connected to the second node NB and may be connected between the power supply voltage VDD and the first node NA. The NMOS transistor MN11 may have a gate electrode connected to the first node NA and may be connected between the second node NB and the first input transistor MN13. The NMOS transistor MN12 may have a gate electrode connected to the second node NB and may be connected between the first node NA and the second input transistor MN14.

The control block 1230 may control operations of the receiving block 1210 and the amplification block 1220 in response to a clock signal CLK. The control block 1230 may include PMOS transistors MP11 and MP14 and a NMOS transistor MN15. Each of transistors MP11, MP14 and MN15 may have a gate electrode receiving the clock signal CLK. The inverter I11 may invert a signal at the first node NA to generate the data signal DS.

The second buffer circuit 1200a of FIG. 7 may be implemented with various structures according to some example embodiments. In an example embodiment, the second buffer circuit 1200a may further include a transistor array (not illustrated) for compensating skew of the data signal DS. The transistor array may be connected to an output terminal of the second buffer circuit 1200a and may include a plurality of transistors. In another example embodiment, the receiving block included in the second buffer circuit 1200a may further receive the data signal DS for improving an operation speed of the amplification circuit 1220.

Figure 8:
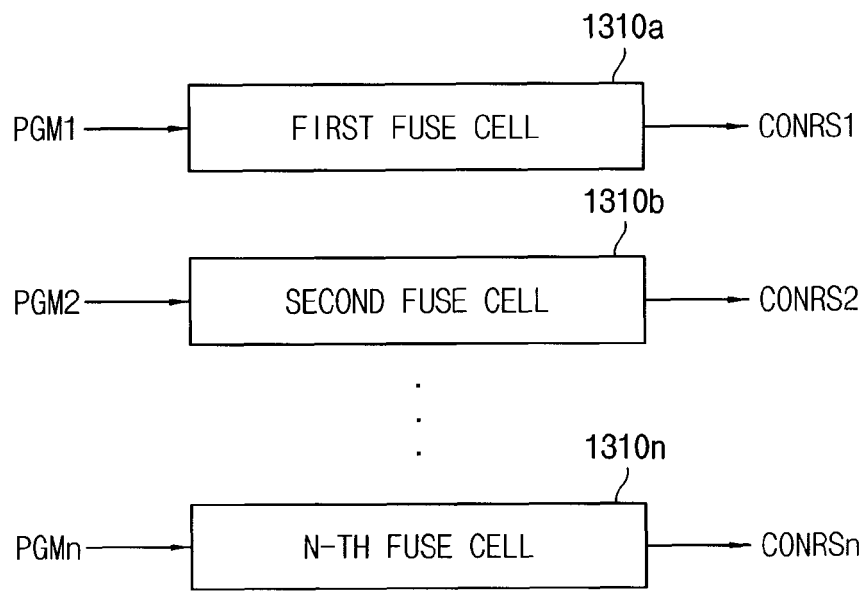
FIG. 8 is a block diagram illustrating an example of a control circuit included in the data receiver of FIG. 1A.

FIG. 8 is a block diagram illustrating an example of the control circuit included in the data receiver of FIG. 1A.

Referring to FIG. 8, the control circuit 1300a may include a plurality of fuse cells. The plurality of fuse cells may include first through n-th fuse cells 1310a, 1310b, ..., 1310n.

Each of the plurality of fuse cells 1310a, 1310b, ..., 1310n may be programmed or unprogrammed in response to a respective one of a plurality of program signals PGM1, PGM2, ..., PGMn and may generate the respective one of the plurality of control signals based on the programmed state. The plurality of control signals may include first through n-th control signals CONRS1, CONRS2, ..., CONRSn. For example, a first fuse cell 1310a may be programmed or unprogrammed in response to a first program signal PGM1 and may generate the first control signal CONRS1 based on whether the first fuse cell 1310a is programmed or not. The plurality of program signals PGM1, PGM2, ..., PGMn may correspond to a mode register set signal that is generated based on an address signal received from the memory controller (not illustrated).

In an example embodiment, each of the plurality of fuse cells 1310a, 1310b, ..., 1310n may include an electrical fuse. For example, the first fuse cell 1310a may include a first electrical fuse and a first reference resistor. The first electrical fuse may be programmed or may be unprogrammed based on a logic level of the first program signal PGM1. When the first program signal PGM1 has the logic low level, the first electrical fuse may be unprogrammed and may have a sufficiently smaller resistance than a resistance of the first reference resistor. When the first program signal PGM1 has the logic high level, a relatively high current may be applied through the first electrical fuse, the first electrical fuse may be programmed (i.e., cut) and may have a larger resistance than the resistance of the first reference resistor since the first electrical fuse operates as an open circuit. The first fuse cell 1310a may compare a voltage between both ends of the first electrical fuse with a voltage between both ends of the first reference resistor to generate the first control signal CONRS1. Thus, a logic level of the first control signal CONRS1 may be determined based on whether the first electrical fuse is programmed or not.

In another example embodiment, each of the plurality of fuse cells 1310a, 1310b, ..., 1310n may include an anti-fuse. For example, the first fuse cell 1310a may include a first anti-fuse and a first reference resistor. The first anti-fuse may be programmed or may be unprogrammed based on the logic level of the first program signal PGM1. When the first program signal PGM1 has the logic high level, the first anti-fuse may be unprogrammed and may have a sufficiently larger resistance than a resistance of the first reference resistor. When the first program signal PGM1 has the logic low level, a relatively high voltage is applied to the first anti-fuse, the first anti-fuse may be programmed (i.e., electrically shorted) and may have a smaller resistance than the resistance of the first reference resistor since the first anti-fuse is electrically shorted. The first fuse cell 1310a may compare a voltage between both ends of the first anti-fuse with a voltage between both ends of the first reference resistor to generate the first control signal CONRS1. Thus, the logic level of the first control signal CONRS1 may be determined based on whether the first anti-fuse is programmed or not.

Figure 9:
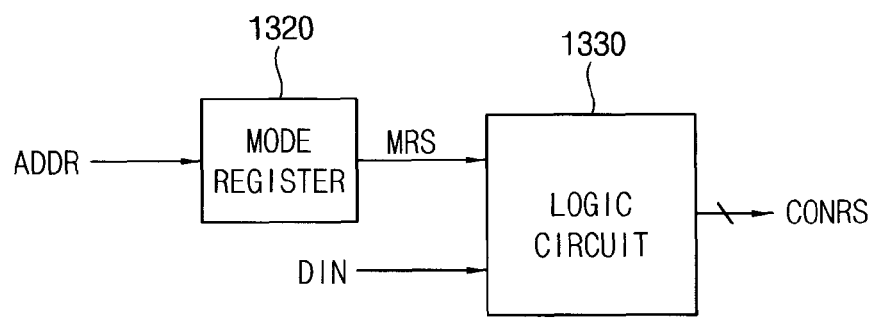
FIG. 9 is a block diagram illustrating another example of the control circuit included in the data receiver of FIG. 1A.

FIG. 9 is a block diagram illustrating an example of the control circuit included in the data receiver of FIG. 1A.

Referring to FIG. 9, the control circuit 1300b may include a mode register 1320 and a logic circuit 1330.

The mode register 1320 may generate a mode register set signal MRS based on an address signal ADDR received from the memory controller (not illustrated). The mode register 1320 may be included in the semiconductor memory device and a value of the mode register set signal MRS may be determined based on a combination of the address signal ADDR.

The logic circuit 1330 may generate the plurality of control signals CONRS based on the mode register set signal MRS and the input data signal DIN. For example, the logic circuit 1330 may perform a logic operation on the mode register set signal MRS and the input data signal DIN (or a command signal, a clock signal and a control signal etc.) to generate the plurality of control signals CONRS. The logic circuit 1330 may include a plurality of logic gates.

FIG. 10 is a block diagram illustrating a semiconductor memory device according to an exemplary embodiment.

Referring to FIG. 10, the semiconductor memory device 2000 includes a data input buffer 2100, a memory cell array 2200, an address buffer 2300, a row decoder 2400, a column decoder 2500 and a data output buffer 2600. The semiconductor memory device 2000 may further include a register (not illustrated), a refresh circuit (not illustrated), a sense amplifier (not illustrated), a prefetch circuit (not illustrated) and a delay locked loop (not illustrated).

The data input buffer 2100 is connected to an external data input/output (I/O) pin DQ. The data input buffer 2100 receives an input data signal DIN from a memory controller (not illustrated) through the data I/O pin DQ. The data input buffer 2100 includes a data receiver 2110 that receives the input data signal DIN to determine logic levels of the input data signal DIN.

The data receiver 2110 may be the data receiver 1000 of FIG. 1A. The data receiver 2110 varies a resistance of data path and a resistance of reference voltage path based on a plurality of control signals CONRS, adjusts a voltage level of the input data signal DIN and a level of a reference voltage VREF based on the varied resistance of the data path and the varied resistance of the reference voltage path, and compares the adjusted input data signal DIN with the adjusted reference voltage VREF to generate a data signal DS. The data receiver 2110 may provide the data signal DS to the memory cell array 2200 or the other internal circuits (not illustrated).

The memory cell array 2200 stores the data signal DS provided from the data input buffer 2100 as write data, and provides read data to the data output buffer 2600 based on the stored write data. The memory cell array 2200 may include a plurality of memory cells that store data.

The address buffer 2300 provides the row address ADDRX and the column address ADDRY to the row decoder 2400 and the column decoder 2500 based on an address signal received from the memory controller through an address pin ADDR. The row decoder 2400 selects a word line of the memory cell array 2200 based on a word line enable signal WL generated by decoding the row address ADDRX. The column decoder 2500 selects at least one bit line of the memory cell array 2200 based on a column selection signal CSL generated by decoding the column address ADDRY.

The data output buffer 2600 is connected to the external data I/O pin DQ. The data output buffer 2600 transfers the read data to the memory controller through the data I/O pin DQ.

In the semiconductor memory device 2000 according to some example embodiments, the data receiver 2110 varies the resistance of the data path and the resistance of the reference voltage path, and adjusts the voltage level of the input data signal DIN based on the varied resistance of the data path and the varied resistance of the reference voltage path. Thus, the semiconductor memory device 2000 may effectively reduce the ringback noise and may have relatively improved signal integrity.

Figure 11A:
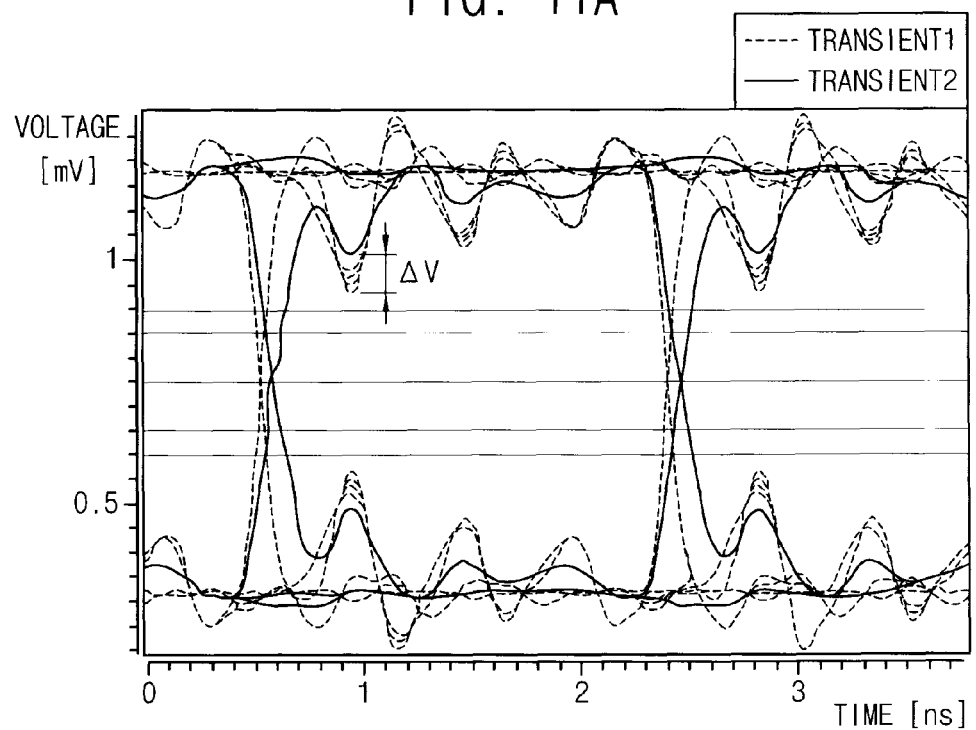
FIGS. 11A and 11B are diagrams for describing performance of the semiconductor memory device according to an exemplary embodiment.
Figure 11B:
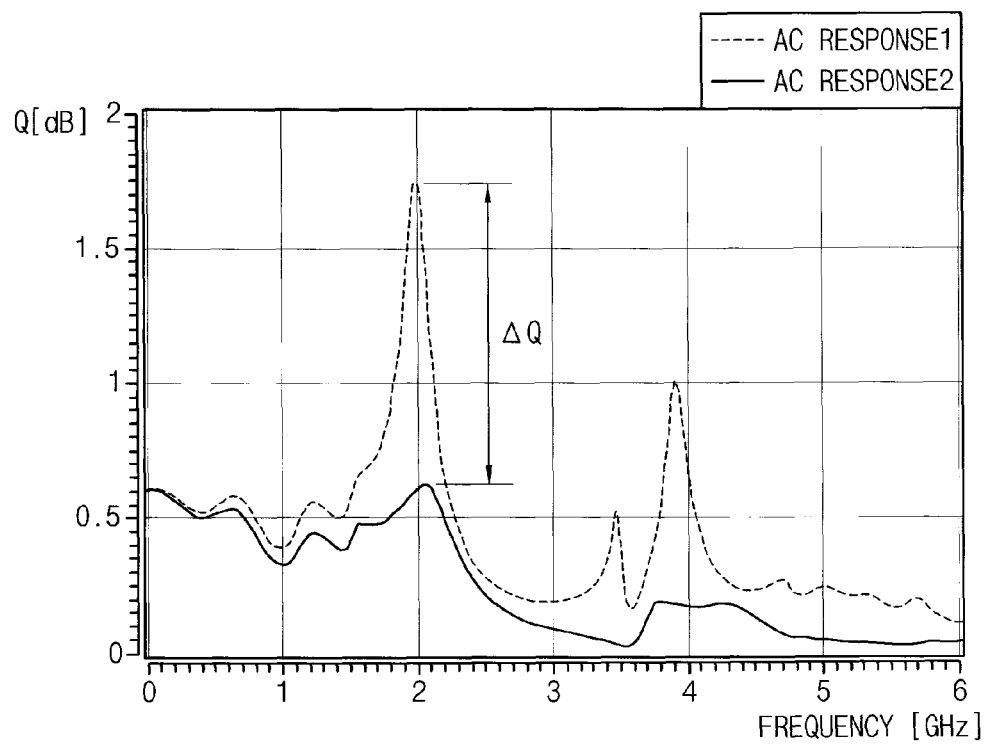

FIGS. 11A and 11B are diagrams for describing performance of the semiconductor memory device according to an exemplary embodiment. FIG. 11A illustrates eye diagrams for a conventional semiconductor memory device and a semiconductor memory device including the data receiver 1000 of FIG. 1A. FIG. 11B illustrates alternating current (AC) responses for the conventional semiconductor memory device and the semiconductor memory device including the data receiver 1000 of FIG. 1A.

The eye diagram indicates that digital waves generated for each data (e.g., 0 or 1) are overlapped in each data period, and is used to evaluate the quality of a data signal. The AC response indicates a transfer function for a data signal on a frequency.

In FIG. 11A, TRANSIENT1 indicates the eye diagram for the conventional semiconductor memory device. TRANSIENT2 indicates the eye diagram for the semiconductor memory device including the data receiver 1000 of FIG. 1A. In FIG. 11B, AC RESPONSE1 indicates the AC response for the conventional semiconductor memory device. AC RESPONSE2 indicates the AC response for the semiconductor memory device including the data receiver 1000 of FIG. 1A.

Referring to FIG. 11A, the degree of distortion in the data signal (i.e., TRANSIENT1) of the semiconductor memory device including the data receiver 1000 of FIG. 1A may be reduced in comparison with the degree of the distortion in the data signal (i.e., TRANSIENT2) of the conventional semiconductor memory device. In addition, the ringback noise in the data signal of the semiconductor memory device including the data receiver 1000 of FIG. 1A may be reduced by ΔV in comparison with the ringback noise in the data signal of the conventional semiconductor memory device.

Referring to FIG. 11B, the resonance peak value in the AC response of the semiconductor memory device including the data receiver 1000 of FIG. 1A may be reduced by ΔQ in comparison with the resonance peak value in the AC response of the conventional semiconductor memory device.

Thus, the semiconductor memory device including the data receiver 1000 of FIG. 1A may have more improved signal integrity than that of the conventional semiconductor memory device.

Figure 12:
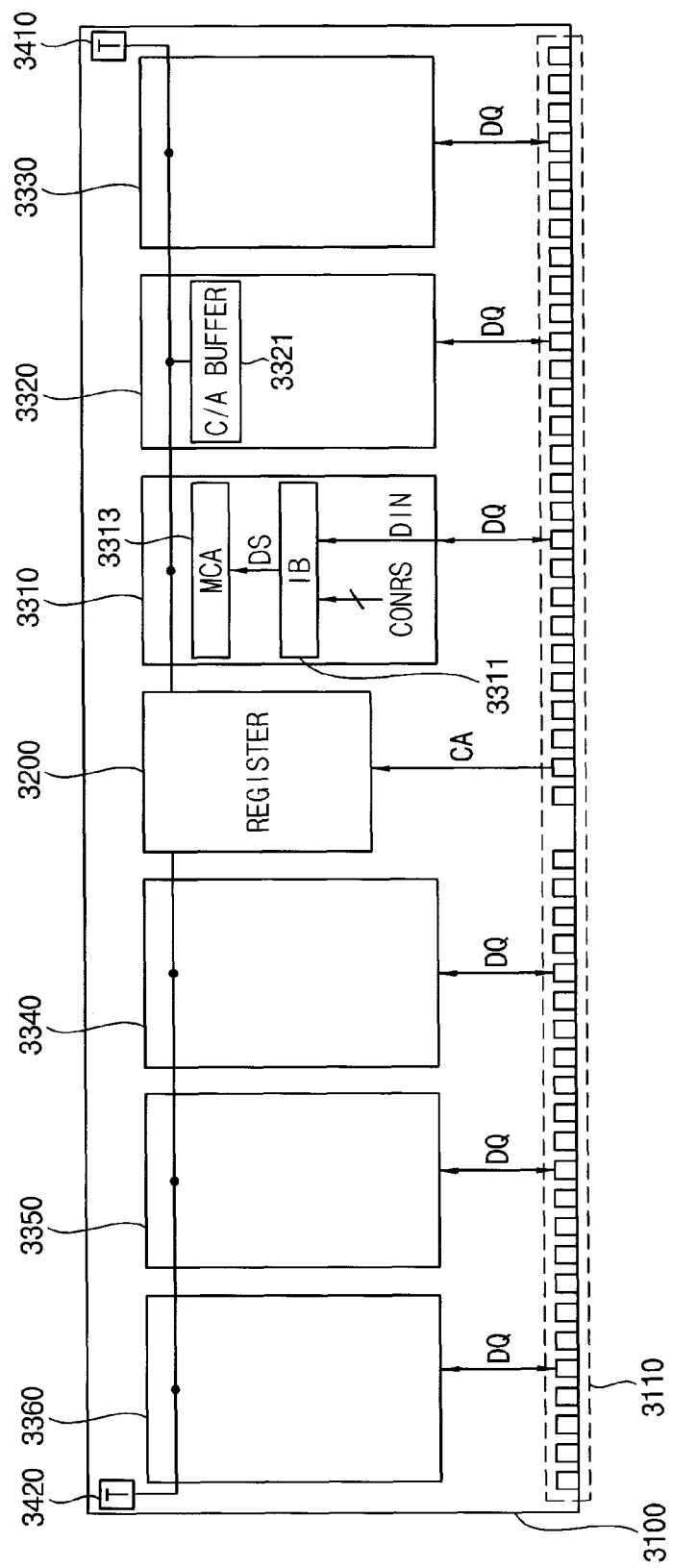
FIG. 12 is a block diagram illustrating a memory module according to an exemplary embodiment.

FIG. 12 is a block diagram illustrating a memory module according to an exemplary embodiment.

Referring to FIG. 12, the memory module 3000 includes a module board 3100 and a plurality of semiconductor memory devices 3310, 3320, 3330, 3340, 3350 and 3360. The memory module 3000 may further include a command/address register 3200 and termination resistor circuit parts 3410 and 3420.

In FIG. 12, the memory module 3000 may be implemented as a dual in-line memory module (DIMM), and particularly as a registered DIMM (RDIMM) including the command/address register 3200. However, structure of the memory module 3000 is not limited thereto. In an example embodiment, the memory module 3000 may be implemented as a fully buffered DIMM (FBDIMM) including a hub such as an advanced memory buffer (AMB). In another example embodiment, the memory module 3000 may be implemented as a load reduced DIMM (LRDIMM).

The plurality of semiconductor memory devices 3310, 3320, 3330, 3340, 3350 and 3360 are mounted on the module board 3100. In an example embodiment, the plurality of semiconductor memory devices 3310, 3320, 3330, 3340, 3350 and 3360 may be mounted only a first surface. In another example embodiment, the plurality of semiconductor memory devices 3310, 3320, 3330, 3340, 3350 and 3360 may be mounted both of the first surface and a second surface corresponding to the first surface.

Each of the plurality of semiconductor memory devices 3310, 3320, 3330, 3340, 3350 and 3360 may be implemented with a semiconductor chip. Each of the plurality of semiconductor memory devices 3310, 3320, 3330, 3340, 3350 and 3360 may be electrically connected to an input/output (I/O) tab 3110 through a respective one of data transmission lines DQ. Each of the plurality of semiconductor memory devices 3310, 3320, 3330, 3340, 3350 and 3360 may transmit and receive data signals to and from an external device (not illustrated) such as a memory controller.

Each of the plurality of semiconductor memory devices 3310, 3320, 3330, 3340, 3350 and 3360 may be the semiconductor memory device 2000 of FIG. 10. For example, a first semiconductor memory device 3310 may include a first data input buffer 3311 and a first memory cell array 3313. The first data input buffer 3311 includes a first data receiver that may be the data receiver 1000 of FIG. 1A. The first data receiver varies a resistance of a data path and a resistance of a reference voltage path based on a plurality of control signals CONRS, adjusts a voltage level of an input data signal DIN and a level of a reference voltage based on the varied resistance of the data path and the varied resistance of the reference voltage path, and compares the input data signal DIN with the reference voltage to generate a data signal DS. The first memory cell array 3313 stores the data signal DS and outputs stored data. The second through sixth semiconductor memory devices 3320, 3330, 3340, 3350 and 3360 may have substantially the same structure as the first semiconductor memory devices 3310, respectively.

A second semiconductor memory device 3320 may include a first C/A buffer. The first C/A buffer 3321 includes a first buffer circuit that may be the buffer circuit 1000' of FIG. 1B. The first buffer circuit varies a resistance of a signal path and a resistance of a control signal path based on a plurality of control signals CONRS, adjusts a voltage level of an input signal INPUT and a level of an input control signal CONIN based on the varied resistance of the signal path and the varied resistance of the control signal path, and generates an output signal OUTPUT based on the internal control signal INTCON. The first and third through sixth semiconductor memory devices 3310, 3330, 3340, 3350 and 3360 may have substantially the same structure as the second semiconductor memory devices 3320, respectively. In further embodiment, the input control signal CONIN may provide directly to the second buffer circuit 1200' without through the first buffer circuit 1100'.

The command/address register 3200 may receive a command signal and an address signal from the memory controller through the I/O tab 3110 and a command/address transmission line CA. The command signal and the address signal may be provided to the plurality of semiconductor memory devices 3310, 3320, 3330, 3340, 3350 and 3360. The termination resistor circuit parts 3410 and 3420 may be connected to both ends of the command/address transmission line CA. The command/address register 3200 may be connected to the plurality of semiconductor memory devices 3310, 3320, 3330, 3340, 3350 and 3360 in a daisy-chain topology. However, structure of the command/address transmission line CA is not limited thereto. For example, the command/address register 3200 may be connected to the plurality of semiconductor memory devices in a fly-by daisy-chain topology.

In an example embodiment, each data receiver may have a resistance that is different from each other data receiver included in the other semiconductor memory device. That is, the resistance of the data path of each data receiver is different from each other. As illustrated in FIG. 12, if the memory module 3000 is implemented as the RDIMM and the command/address register 3200 is connected to the plurality of semiconductor memory devices 3310, 3320, 3330, 3340, 3350 and 3360 in the daisy-chain topology, a data receiver that is closest to a start point of the command/address transmission line CA and is closest to the command/address register 3200 may have a larger resistance than resistances of the other data receivers. For example, the first data receiver included in the first semiconductor memory device 3310 may have a larger resistance than a resistance of a second data receiver included in the second semiconductor memory device 3320 and a resistance of a third data receiver included in the third semiconductor memory device 3330. A fourth data receiver included in the fourth semiconductor memory device 3340 may have a larger resistance than a resistance of a fifth data receiver included in the fifth semiconductor memory device 3350 and a resistance of a sixth data receiver included in the sixth semiconductor memory device 3360.

When the input data signal DIN is input, the command signal and the address signal are applied to each of the semiconductor memory devices 3310, 3320, 3330, 3340, 3350 and 3360, signal reflection may be occurred at a boundary portion where the transmission line and each of the semiconductor memory devices 3310, 3320, 3330, 3340, 3350 and 3360 are connected to each other due to a difference in impedance value between the transmission line and a part e.g., the semiconductor memory device, connected to the transmission line. A reflected signal generated due to the signal reflection becomes noise on the transmission line. In general, the noise generated due to the reflected signal appears most at the foremost end of the transmission line, that is, in the first and fourth semiconductor memory devices 3310 and 3340 which are closest to the command/address register 3200. Thus, the ringback noise of the first and fourth data receivers included in the first and fourth semiconductor memory devices 3310 and 3340 may be reduced by having larger resistances than resistances of the other data receivers.

FIG. 13 is a block diagram illustrating a memory module according to an exemplary embodiment.

Referring to FIG. 13, the memory module 4000 includes a module board 4100 and a plurality of semiconductor memory devices 4210, 4220, 4230, 4240, 4250 and 4260. The memory module 4000 may further include a termination resistor circuit 4310. In FIG. 13, the memory module 4000 may be implemented as an unbuffered DIMM (UDIMM).

The plurality of semiconductor memory devices 4210, 4220, 4230, 4240, 4250 and 4260 are mounted on the module board 4100. Each of the plurality of semiconductor memory devices 4210, 4220, 4230, 4240, 4250 and 4260 may be electrically connected to an I/O tab 4110 through a respective one of data transmission lines DQ. Each of the plurality of semiconductor memory devices 4210, 4220, 4230, 4240, 4250 and 4260 may transmit and receive data signals to and from the memory controller. Each of the plurality of semiconductor memory devices 4210, 4220, 4230, 4240, 4250 and 4260 may be the semiconductor memory device 2000 of FIG. 10. For example, a first semiconductor memory device 4210 may include a first data input buffer 4211 and a first memory cell array 4213. The first data input buffer 4211 includes a first data receiver that may be the data receiver 1000 of FIG. 1A. The second through sixth semiconductor memory devices 4220, 4230, 4240, 4250 and 4260 may have substantially the same structure as the first semiconductor memory device 4210, respectively.

The memory module 4000 may receive a command signal and an address signal from the memory controller through the I/O tab 4110 and a command/address transmission line CA. The command signal and the address signal may be provided to the plurality of semiconductor memory devices 4210, 4220, 4230, 4240, 4250 and 4260. The termination resistor circuit 4310 may be connected to one end of the command/address transmission line CA. The command/address transmission line CA may be connected to the plurality of semiconductor memory devices 4210, 4220, 4230, 4240, 4250 and 4260 in the fly-by daisy-chain topology. However, structure of the command/address transmission line CA is not limited thereto. For example, the command/address transmission line CA may be connected to the plurality of semiconductor memory devices in a tree topology.

A second semiconductor memory device 4220 may include a first C/A buffer. The first C/A buffer 4221 may be the same structure with the first C/A buffer 3321 of FIG. 12. For convenience, an illustration of the first C/A buffer 4221 will be omitted.

In an example embodiment, each data receiver may have a resistance that is different from each other data receiver included in the other semiconductor memory device. That is, the resistance of the data path of each data receiver is different from each other. As illustrated in FIG. 13, if the memory module 4000 is implemented as the UDIMM and the command/address transmission line CA is connected to the plurality of semiconductor memory devices 4210, 4220, 4230, 4240, 4250 and 4260 in the fly-by daisy-chain topology, a data receiver that is closest to a start point of the command/address transmission line CA and is closest to an edge of the module board 4100 may have a larger resistance than resistances of the other data receivers. For example, the first data receiver included in the first semiconductor memory device 4210 may have a larger resistance than resistances of second through sixth data receivers included in the second through sixth semiconductor memory devices 4220, 4230, 4240, 4250 and 4260, respectively. As described above, the noise generated due to the reflected signal appears most at the foremost end of the transmission line, that is, in the first semiconductor memory device 4210 which is closest to the edge of the module board 4100. Thus, the ringback noise of the first data receiver included in the first semiconductor memory device 4210 may be reduced by having a larger resistance than resistances of the other data receivers.

Although the memory modules 3000 and 4000 including six semiconductor memory devices are illustrated in FIGS. 12 and 13 for convenience of illustration, the number of the semiconductor memory devices included in the memory modules 3000 and 4000 is not limited thereto.

As described above, the data receiver and the buffer according to some example embodiments may be adopted in all kinds of communication systems. Particularly, the data receiver and the buffer according to some example embodiments may be adopted in a semiconductor memory device, a memory module and a memory system.

While the example embodiments and their advantages have been described in detail, it should be understood that various changes, substitutions and alterations may be made herein without departing from the scope of the inventive concept.

What is claimed is:
1. A data receiver comprising:
a first buffer circuit configured to vary a resistance of a data path and a resistance of a reference voltage path based on a plurality of control signals, and configured to adjust a voltage level of an input data signal and a level of a reference voltage to generate an internal data signal and an internal reference voltage based on the varied resistance of the data path and the varied resistance of the reference voltage path; and
a second buffer circuit configured to compare the internal data signal with the internal reference voltage to generate a data signal.
2. The data receiver of claim 1, wherein the first buffer circuit includes:
a first variable resistor circuit forming a portion of the data path, the first variable resistor circuit having a first resis- tance varied based on the plurality of control signals, and adjusting the voltage level of the input data signal based on the first resistance; and a second variable resistor circuit forming a portion of the reference voltage path, the second variable resistor circuit having a second resistance varied based on the plurality of control signals, and adjusting the level of the reference voltage based on the second resistance.

3. The data receiver of claim 2, wherein the first variable resistor circuit includes a plurality of first resistor circuit parts connected in parallel between a data input terminal and a first node, and the second variable resistor circuit includes a plurality of second resistor circuit parts connected in parallel between a reference voltage input terminal and a second node.

4. The data receiver of claim 3, wherein each of the plurality of first resistor circuit parts includes:
a resistor connected to the data input terminal; and
a transmission gate connected between the resistor and the first node, and configured to operate in response to a respective one of the plurality of control signals.

5. The data receiver of claim 3, wherein each of the plurality of first resistor circuit parts includes:
a first transistor connected between the data input terminal and the first node, the first transistor having a gate electrode receiving a respective one of the plurality of control signals; and
a second transistor connected between the data input terminal and the first node, the second transistor having a gate electrode connected to the data input terminal.

6. The data receiver of claim 2, wherein the first buffer circuit further includes:
a third variable resistor circuit serially connected to the first variable resistor circuit along the data path, the third variable resistor circuit having a third resistance varied based on the plurality of control signals, and adjusting a voltage level of an output signal of the first variable resistor circuit based on the third resistance; and
a fourth variable resistor circuit serially connected to the second variable resistor circuit along the reference voltage path, the fourth variable resistor circuit having a fourth resistance varied based on the plurality of control signals, and adjusting a voltage level of an output signal of the second variable resistor circuit based on the fourth resistance.

7. The data receiver of claim 2, wherein the first buffer circuit further includes:
a first electrostatic discharge (ESD) protection circuit connected to an output of the first variable resistor circuit, and configured to reduce high voltage components of the input data signal; and
a second ESD protection circuit connected to an output of the second variable resistor circuit, and configured to reduce high voltage components of the reference voltage.

8. The data receiver of claim 1, further comprising:
a control circuit configured to generate the plurality of control signals based on a plurality of program signals, wherein the control circuit includes:
a plurality of fuse cells programmable in response to the plurality of program signals and configured to generate the control signals based on a programmed state of the plurality of fuse cells.

9. The data receiver of claim 1, further comprising:
a control circuit configured to generate the plurality of control signals based on a plurality of address signals, wherein the control circuit includes:

a logic circuit configured to perform a logic operation on a mode register set signal and the input data signal to generate the plurality of control signals, the mode register set signal being generated based on the plurality of address signals.

10. A semiconductor device comprising:
a control circuit configured to generate a plurality of control signals;
a first buffer circuit including:
a first variable resistor circuit to generate a first variable resistance, the first variable resistor circuit configured to receive an input signal through an input terminal and to pass the input signal through the first variable resistance to generate a first internal signal in response to at least one of the control signals; and
a second variable resistor circuit to generate a second variable resistance, the second variable resistor circuit configured to receive a reference voltage through a reference voltage terminal and to pass the reference voltage through the second variable resistance to generate a first internal reference voltage in response to at least one of the control signals,
a second buffer circuit configured to receive the first internal signal and the first internal reference voltage to generate an output signal.

11. The semiconductor device of claim 10, wherein the plurality of control signals are generated based on a plurality of program signals or a plurality of address signals.

12. The semiconductor device of claim 10, wherein the semiconductor device is one of a data input buffer, an address buffer, a command buffer, a control buffer and a clock buffer.

13. The semiconductor device of claim 10, wherein the second buffer circuit comprises a latch having an output of the output signal.

14. The semiconductor device of claim 10,
wherein the first variable resistor circuit comprises a plurality of first circuit parts connected in parallel between a first node, connected to receive the input signal, and a second node, connected to output the first internal signal,
wherein the second variable resistor circuit comprises a plurality of second circuit parts connected in parallel between a third node, connected to receive the reference voltage, and a fourth node, connected to output the first internal reference voltage, and
wherein each of the first circuit parts and second circuit parts comprise a resistor and a switch connected in series, the switch being responsive to at least one of the plurality of control signals.

15. A memory device comprising:
an input terminal to receive an input signal external to the memory device; and
a buffer circuit comprising:
a first buffer circuit including a plurality of resistors to generate a first variable resistance, the first buffer circuit connected to the input terminal and configured to receive the input signal and output an internal signal through the first variable resistance in response to a plurality of control signals;
a second buffer circuit configured to receive the internal signal and to generate an output signal; and
a control circuit configured to generate the plurality of control signals to select the first variable resistance.

16. The memory device of claim 15, wherein the plurality of control signals are generated based on a plurality of program signals or a plurality of address signals.

17. The memory device of claim 15, further comprising:
a control input terminal to receive a control input signal external to the memory device,
wherein the first buffer circuit further including a plurality of resistors to generate a second variable resistance, the first buffer circuit connected to the control input terminal and configured to receive the control input signal and output an internal control signal through the second variable resistance in response to the plurality of control signals.

18. The memory device of claim 15, wherein the buffer circuit is one of a data input buffer, an address buffer, a command buffer, a control buffer and a clock buffer.

19. A memory module comprising:
a module board; and
a plurality of memory devices mounted on the module board, each comprising the memory device of claim 15.

20. The memory module of claim 19, wherein at least two of memory devices have a variable resistance different from each other.

* * * * *